United States Patent [19]

Ludowise

[11] Patent Number: 4,575,576

[45] Date of Patent: Mar. 11, 1986

[54] THREE-JUNCTION SOLAR CELL

[75] Inventor: Michael J. Ludowise, Cupertino, Calif.

[73] Assignee: The United States of America as represented by the United States Department of Energy, Washington, D.C.

[21] Appl. No.: 669,273

[22] Filed: Nov. 7, 1984

[51] Int. Cl.⁴ ............................................. H01L 31/06
[52] U.S. Cl. ..................................... 136/249; 357/30; 136/244
[58] Field of Search ...................... 136/249 TJ; 357/30

[56] References Cited

U.S. PATENT DOCUMENTS 4,338,480  7/1982  Antypas et al. .............. 136/249 TJ
4,356,341 10/1982  Borden et al. ................ 136/249 TJ
4,513,168  4/1985  Borden ............................. 136/244

Primary Examiner—Aaron Weisstuch
Attorney, Agent, or Firm—L. E. Carnahan; Roger S. Gaither

[57] ABSTRACT

A photovoltaic solar cell is formed in a monolithic semiconductor. The cell contains three junctions. In sequence from the light-entering face, the junctions have a high, a medium, and a low energy gap. The lower junctions are connected in series by one or more metallic members connecting the top of the lower junction through apertures to the bottom of the middle junction. The upper junction is connected in voltage opposition to the lower and middle junctions by second metallic electrodes deposited in holes 60 through the upper junction. The second electrodes are connected to an external terminal.

7 Claims, 7 Drawing Figures

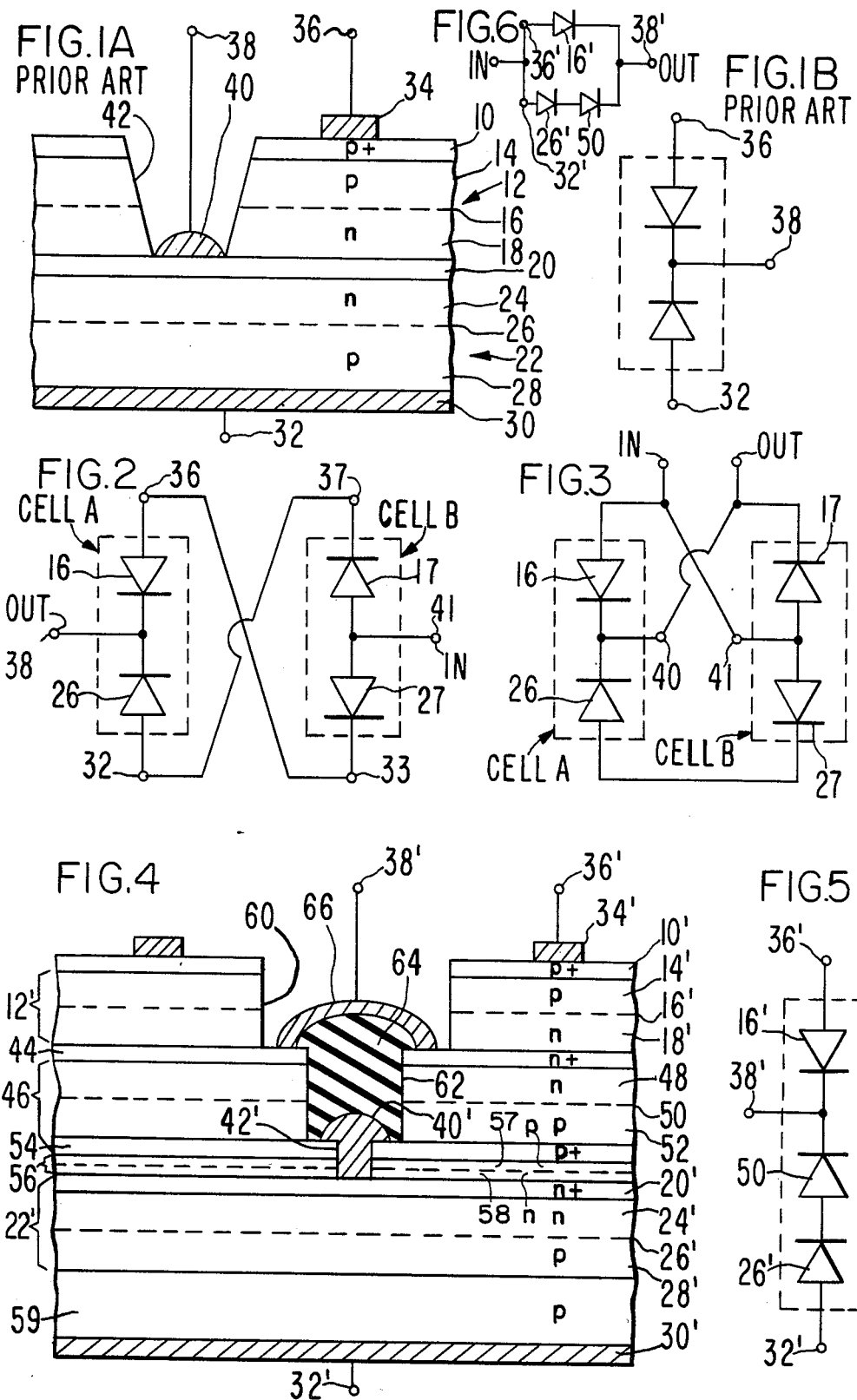

THREE-JUNCTION SOLAR CELL

The Government has rights in this invention pursuant to Subcontract No. XP-9-8081-1 under Contract No. EG-77-C-01-4042 awarded by the U.S. Department of Energy.

FIELD OF THE INVENTION

The invention pertains to photovoltaic cells such as used for direct conversion of sunlight to electricity. Sunlight contains a wide spectrum of photon energies. A simple photovoltaic cell is most efficient when the energy gap at its p-n junction is just below the incident photon energy. Therefore, the efficiency suffers when such a cell is used for sunlight.

PRIOR ART

Early in the work on solar cells it became obvious that efficiency could be improved by a multiple junction cell. The light would fall on a semiconductor layer containing a first p-n junction with a relatively high energy gap. The short waves would be absorbed, thereby giving carriers enough energy to cross the gap. The longer waves do not have enough photon energy and thus pass through the layer, which is relatively transparent to them. Beneath this first junction would be a second p-n junction in a layer with lower energy gap which absorbs the low energy waves and drives current across the second junction.

There are some inherent problems in the multijunction cell. It is highly desirable to have a monolithic structure with the junctions in successive layers having the proper doping. If internal interconnect problems are to be avoided, this naturally results in the junctions in a sequential direction being p-n-n-p or n-p-p-n. Thus the voltages across the two junctions are in opposition. Because the cells are low voltage generators, it is desirable to connect them in series.

Several schemes have been tried to make a p-n/p-n stack so the voltages will add in series. Among these have been tunneling junctions between the sub-cells, or transparent ohmic connections. Neither of these has been very successful.

It has been proposed to make a cell with two junctions arranged p-n-p-n and form metallic contacts through apertures in the upper junction layers so as to connect the upper junction layers to the lower junction layers to form a p-n-contact-p-n sequence. In this way only a small fraction of the cell area would be opaque and hence unproductive, while the junctions would be electrically in series. There is still a serious drawback to series-connected junctions. The current through the two junctions must be the same. Since they respond to different light wavelengths, this current equality is a function of the spectral distribution of the incident light.

SUMMARY OF THE INVENTION

The purpose of the invention is to provide a three-junction photovoltaic cell adapted for series-parallel connection with similar cells to provide high-efficiency conversion of solar light into electricity.

A second purpose is to provide all three junctions in a monolithic structure to simplify the assembly.

BRIEF DESCRIPTION OF THE FIGURES

FIG. 1A is a schematic cross-section of a prior art cell with two junctions and three terminals.

FIG. 1B is a connection diagram of the active junctions of the cell of FIG. 1A.

FIG. 2 is a three-terminal connection diagram of a pair of three-terminal cells such as the one of FIG. 1A.

FIG. 3 is a connection diagram of a pair of three-terminal cells in a series-parallel circuit.

FIG. 4 is a schematic cross-section of a three-junction, three-terminal cell embodying the invention.

FIG. 5 is a connection diagram of the cell of FIG. A.

FIG. 6 is an alternative connection diagram.

DESCRIPTION OF THE PREFERRED EMBODIMENTS

In the prior-art cell of FIG. 1A the series of active layers in a preferably monolithic semiconductor crystal is, starting from the top side where light enters: a contact cap layer 10 of high-conductivity p-type material; a layer 12 containing an upper region 14 doped p-type, a p-n junction 16 having a relatively high energy band-gap, and a lower region 18 doped n-type; a high-conductivity transparent contact layer 20; a second semiconductive layer 22 containing an upper region 24 doped n-type, an n-p junction 26 having a relatively low energy band-gap, and a lower p-type region 28. On the bottom of region 28 there is bonded a metallic electrode 30 adapted to connect to an external lead 32.

Electrical contact to contact cap layer 10 is made via a bonded metallic electrode 34 which is preferably a grid whose conductors cover only a small part of the surface area, leaving the rest transparent to incoming light. Grid 34 is adapted to connect to an external lead 36.

An intermediate lead 38 connects to contact layer 20 by an array of metallic grid conductors 40 deposited, as by evaporative deposition, in apertures 42 etched, as by photolithographic processes, through contact cap layer 10 and upper semiconductor layer 12.

FIG. 1B shows the schematic electrical connections. The directions of current flow across the two junctions are opposing. The junctions can not be connected directly in parallel because they generate different voltages.

FIG. 2 shows how two three-terminal cells may be connected in a series-parallel circuit. In both cell A and cell B the upper junctions 16, 17, respectively, have high energy gaps. The lower junctions 26, 27 have low energy gaps. The external connections 33, 37, 41 of cell B correspond physically to connections 32, 36, 38 of cell A. However, the conductivity types of cell B have been reversed, as indicated by the arrows, to be n-p/p-n instead of p-n/n-p. With the external connections of FIG. 2 each high-voltage junction 16, 17 is in series with a low-voltage junction 26, 27. The total voltage of the two series sets is the same, so the sets may be connected in parallel to form a circuit unit. Any number of these two-cell circuit units may be series-connected to produce a higher output voltage.

The series connection has the disadvantage mentioned above of requiring equal currents in the high- and low-voltage junctions.

The connection diagram of FIG. 3 is described and claimed in U.S. Pat. No. 4,513,168, issued in the name of Peter Borden and assigned to the assignee of the present invention. In this circuit the connections are changed so that in each circuit unit there is a parallel connection of three elements; high voltage junctions 16, 17 and a series connection of low-voltage junctions 26 and 27. This will work efficiently when the voltage of the lower junctions is one-half that of the upper junctions. This is not an unreasonable relation.

It is generally recognized that a solar cell with three junctions of successively smaller band gaps can be more efficient than a two-junction cell. The more the light is converted to carriers with just the right energy for the junction they cross, the higher the efficiency.

FIG. 4 illustrates an embodiment of the invention with three junctions and three terminals.

Starting from the top side of the monolithic cell as before, the layers of semiconductive material are successively: a transparent contact layer 10' of high conductivity p-type; a layer 12' comprising an upper p-type region 14', a p-n junction 16' of high energy gap and a lower n-type region 18'; a transparent high-conductivity contact layer 44; a second layer 46 comprising an upper n-type region 48, an n-p junction 50 of medium energy gap, a lower p-type region 52, and a high-conductivity p-type layer 54; a high-gap transparent transition layer 56 comprising a p-type region 57 and an n-type region 58 serving as a minority carrier diffusion barrier; a layer 22' comprising another high-conductivity layer 20', an upper n-type layer 24', an n-p junction 26' having a low energy gap, and a lower p-type layer 28'; and a substrate p-type layer 59. Over the bottom of substrate layer 59 is bonded a metallic electrode layer 30'.

Over the top of contact cap layer 10' is deposited as by evaporation a metallic electrode 34' shaped to cover only a small part of contact cap layer 10', so that most of the incident light passes through without interception. Electrode 34' may be a peripheral ring or an array of conductive, narrow web members. Electrodes 30' and 34' are provided with respective means 32', 36' for connection to an external current-collecting circuit.

Internal connections between the active junctions are provided via one or more recesses 60, which are etched by well known photolithographic processes. The inner, deeper part 42' of recess 60 penetrates to the top of the high-conductivity layer 20'.

A deposited metallic connector 40' connects via hole 42' through barrier layer 56 and high-conductivity layer 54 to the top of the layer 54. Thus lower junction 26' and intermediate junction 50 are connected in series.

An intermediate hole 62, larger than lower hole 42' penetrates from the top of high-conductivity layer 44 to the top of high-conductivity layer 54. Intermediate hole 62 is filled with insulating material 64, such as silicon dioxide, as by a vapor-deposition process.

An external connection to the top of high-conductivity layer 44 is made by a metallic connector electrode 66 deposited through upper hole 60 which is larger than intermediate hole 62. Hole 60 is preferably a groove leading to the edge of the cell where conductors 66 are connected to an external circuit lead 38'. Thus upper junction 16' and intermediate junction 50 are connected in voltage opposition.

There can be an array of lower through-connectors 40' spaced over the cell area to reduce resistive losses in the semiconductors. Since they have no external connections they need not be internally connected. A multiplicity of intermediate connectors 66 must however be connected together, as a grid pattern in the cell or to a collector electrode at its periphery.

FIG. 5 is a connection diagram of the cell of FIG. 4. The external connections are equivalent to those of the two-junction cell of FIGS. 1. Individual cells may thus be connected externally by the series connection of FIG. 3 in which the low-voltage junction 26 is replaced by a series pair of junctions 50, 26'. In either case the two-celled modules may be connected in series to provide a higher voltage. In the FIG. 2 connection all three junctions must carry the same current. In the FIG. 3 case the two lower junctions should be of equal current and preferably the sum of their voltages should be equal to one-half the voltage of the upper junction.

FIG. 6 shows an alternative connection which is possible only with the inventive cells. Here the sum of the voltages of the middle and lower junctions is made equal to the voltage of the upper junction so that the series connected middle and lower may be directly connected in parallel with the upper junction. For example, if the upper junction develops 1.0 volt, the middle might be designed for ⅔ volt and the lower for ⅓ volt.

It will be obvious to those skilled in the art that other embodiments of the invention may be made. The above description is intended to be exemplary and not limiting. The scope of the invention is to be limited only by the following claims and their legal equivalents.

What is claimed is:

1. A monolithic photovoltaic cell comprising:
   an upper surface layer adapted for entrance of exciting light,
   three semiconductive layers positioned sequentially with respect to a position starting from said upper surface layer, namely an upper layer, a middle layer, and a lower layer,
   within each of said semiconductive layers, a photovoltaic junction, thus providing upper, middle, and lower junctions, said upper junction having a first polarity with respect to said upper surface, said middle and lower junctions having a second polarity opposite to that of said upper junction,
   a conductive substrate beneath said lower layer,
   a conductive electrode connected to said substrate,
   a light-permeable electrode attached to the upper surface of said upper surface layer,
   a high gap transparent layer between said middle layer and said lower layer,
   a first high conductivity layer between said middle layer and said high-gap transparent layer,
   an aperture through said upper, middle, first high conductivity, and transparent layers, said aperture having stepped sides exposing a portion of the upper surfaces of said middle layer, said first high conductivity layer, and said lower layer,
   a first metallic conductor in said aperture in ohmic contact with the top of said bottom layer and in overlapping contact with the top of said first high conductivity layer,
   a second metallic conductor in said aperture insulated from said first conductor and in contact with the upper surface of said middle layer, and
   means for external electrical connections to said substrate connected electrode, said light permeable electrode, and said second conductor.

2. The cell of claim 1 further comprising an insulating body between said first and second metallic conductors in said aperture.

3. The cell of claim 1 wherein said upper surface layer comprises a second high conductivity layer between said light permeable electrode and said upper semiconductive layer.

4. The cell of claim 3 further comprising a third high conductivity layer between said upper semiconductive layer and said middle semiconductive layer, said second metallic conductor in said aperture being in contact with the upper surface of said third high conductivity layer.

5. The cell of claim 4 further comprising a fourth high conductivity layer between said high-gap transparent layer and said lower semiconductive layer, said first metallic conductor in said aperture being in contact with the upper surface of said fourth high conductivity layer.

6. The cell of claim 1 wherein the sum of the photovoltaic potentials of said middle and lower junctions is approximately equal to the photovoltaic potential of said upper photovoltaic junction.

7. The cell of claim 1 wherein the sum of the photovoltaic potentials of said middle and lower junctions is approximately equal to one-half the photovoltaic potential of said upper junctions.

* * * * *